(12) United States Patent
Hui et al.

(10) Patent No.: US 8,816,421 B2
(45) Date of Patent: Aug. 26, 2014

(54) SEMICONDUCTOR DEVICE WITH SEMICONDUCTOR FINS AND FLOATING GATE

(75) Inventors: Frank Hui, Irvine, CA (US); Neal Kistler, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 23 days.

(21) Appl. No.: 13/460,336

(22) Filed: Apr. 30, 2012

(65) Prior Publication Data

US 2013/0285135 A1    Oct. 31, 2013

(51) Int. Cl.
*H01L 29/788* (2006.01)

(52) U.S. Cl.
USPC ..... 257/318; 257/316; 257/326; 257/E29.129

(58) Field of Classification Search
USPC .......... 257/314, 315, 316, 318, 326, E29.129, 257/E29.3, E21.179, E21.422; 438/211, 438/257
See application file for complete search history.

(56) References Cited

U.S. PATENT DOCUMENTS

| 4,380,057 A * | 4/1983 | Kotecha et al. ............... 365/184 |
| 6,958,512 B1 * | 10/2005 | Wu et al. ....................... 257/315 |
| 2007/0072369 A1 * | 3/2007 | Young et al. .................. 438/257 |

* cited by examiner

*Primary Examiner* — Tucker Wright
(74) *Attorney, Agent, or Firm* — Oblon, Spivak, McClelland, Maier & Neustadt, L.L.P.

(57) ABSTRACT

According to one exemplary implementation, a semiconductor device includes a channel, a source, and a drain situated in a first semiconductor fin. The channel is situated between the source and the drain. The semiconductor device also includes a control gate situated in a second semiconductor fin. A floating gate is situated between the first semiconductor fin and the second semiconductor fin. The semiconductor device can further include a first dielectric region situated between the floating gate and the first semiconductor fin and a second dielectric region situated between the floating gate and the second semiconductor fin.

17 Claims, 6 Drawing Sheets

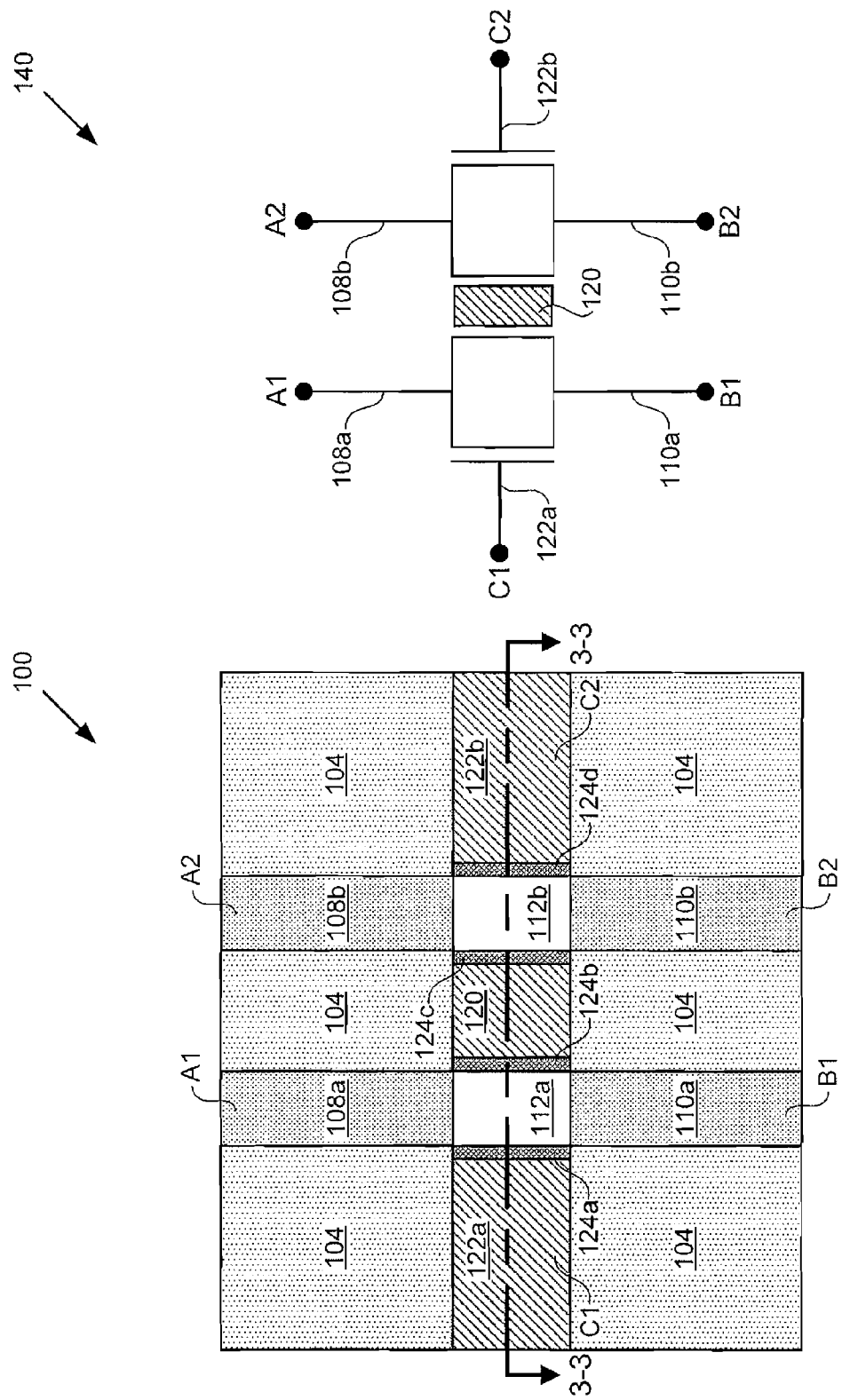

US 8,816,421 B2

SEMICONDUCTOR DEVICE WITH SEMICONDUCTOR FINS AND FLOATING GATE

BACKGROUND

A floating gate field-effect transistor (FET) is typically a planar transistor having a floating gate situated over a channel and a control gate situated over the floating gate. The floating gate is electrically insulated from the control gate and the channel, and charge may be stored in the floating gate. Fowler-Nordheim tunneling and hot-carrier injection are two approaches that can be utilized to modify the amount of charge stored in the floating gate. The charge stored in the floating gate can remain even when there is no power being applied to the floating gate FET.

Floating gate FETs have been utilized in various applications. As one example, floating gate FETs have been utilized as digital storage elements in erasable programmable read-only memory (EPROM), electrically erasable programmable read-only memory (EEPROM) and flash memory. As other examples, floating gate FETs have been utilized as neuronal computational elements in neural networks, analog storage elements, electronic potentiometers, and single-transistor digital-to-analog converters (DACs).

SUMMARY

The present disclosure is directed to semiconductor device with semiconductor fins and floating gate, substantially as shown in and/or described in connection with at least one of the figures, and as set forth more completely in the claims.

BRIEF DESCRIPTION OF THE DRAWINGS

FIG. 1B illustrates a top view of an exemplary semiconductor device.

FIG. 1C illustrates a schematic diagram of an exemplary semiconductor device.

DETAILED DESCRIPTION

Figure 1A:
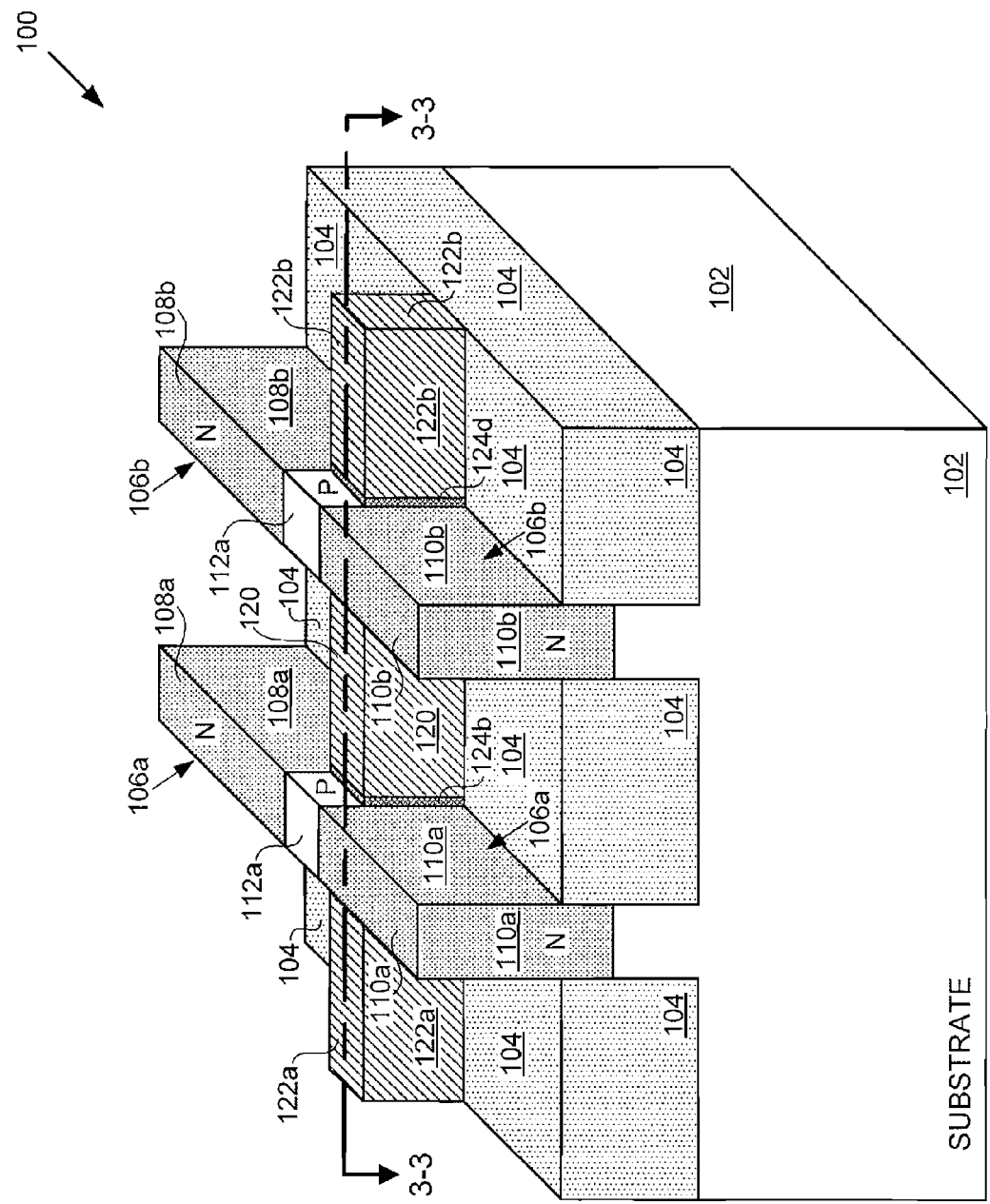
FIG. 1A illustrates a perspective view of an exemplary semiconductor device.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A illustrates a perspective view of an exemplary semiconductor device 100. FIG. 1B illustrates a top view of the exemplary semiconductor device 100. FIG. 1C illustrates a schematic diagram 140 of the exemplary semiconductor device 100. The semiconductor device 100 includes a substrate 102, a dielectric layer 104, semiconductor fins 106a and 106b, a floating gate 120, electrodes 122a and 122b, and dielectric regions 124a, 124b, 124c, and 124d.

In the semiconductor device 100, the substrate 102 includes semiconductor material, such as single-crystal semiconductor material. In the present implementation, the substrate 102 is a silicon substrate and more particularly is monocrystalline silicon. In the implementation shown, the substrate 102 is a P type substrate. It is noted that in other implementations, the substrate 102 is an N type substrate or is undoped. Also, in other implementations, the substrate 102 is a semiconductor on insulator substrate, such as a silicon on insulator substrate (SOI).

The semiconductor fins 106a and 106b include semiconductor material, and in the present implementation are silicon. The semiconductor fins 106a and 106b are formed in and on the substrate 102. The semiconductor fin 106a is situated between the floating gate 120 and the electrode 122a. The semiconductor fin 106b is situated between the floating gate 120 and the electrode 122b. The semiconductor fin 106a includes a source 108a, a drain 110a, and a channel 112a that is situated between the source 108a and the drain 110a. The semiconductor fin 106b includes a source 108b, a drain 110b, and a channel 112b that is situated between the source 108b and the drain 110b. The semiconductor fin 106a is situated between the dielectric region 124a and the dielectric region 124b. More particularly, the channel 112a of the semiconductor fin 106a is situated between the dielectric region 124a and the dielectric region 124b. The semiconductor fin 106b is situated between the dielectric region 124c and the dielectric region 124d. More particularly, the channel 112b of the semiconductor fin 106b is situated between the dielectric region 124c and the dielectric region 124d.

The sources 108a and 108b, the drains 110a and 110b, and the channels 112a and 112b are doped regions of the semiconductor fins 106a and 106b. FIG. 1A shows an implementation where the sources 108a and 108b and the drains 110a and 110b are N type and the channels 112a and 112b are P type. However, the sources 108a and 108b, the drains 110a and 110b, and the channels 112a and 112b can be doped differently than what is shown in FIG. 1A and furthermore, can be doped differently with respect to one another. In some implementations, for example, the sources 108a and 108b and the drains 110a and 110b are P type and the channels 112a and 112b are N type. In the present implementation, the channels 112a and 112b have a similar doping profile as the substrate 102, however, the channels 112a and 112b can have a different doping profile than the substrate 102 and/or one another.

Also in the implementation shown, the dielectric layer 104 is situated over the substrate 102. The dielectric layer 104 includes one or more dielectric materials, such as silicon dioxide. In the present implementation, the dielectric layer 104 is a shallow trench isolation (STI) layer and underlies the floating gate 120 and the electrodes 122a and 122b.

The electrode 122a is situated adjacent to, but is electrically insulated from the channel 112a of the semiconductor fin 106a. The electrode 122b is situated adjacent to, but electrically insulated from the channel 112b of the semiconductor fin 106b. The floating gate 120 is situated between the semiconductor fin 106a and the semiconductor fin 106b. Also, the dielectric region 124b is situated between the floating gate 120 and the semiconductor fin 106a. The dielectric region 124c is situated between the floating gate 120 and the semiconductor fin 106b. Thus, the floating gate 120 is electrically insulated from the channel 112a of the semiconductor fin 106a and the channel 112b of the semiconductor fin 106b.

The electrodes 122a and 122b and the floating gate 120 include conductive material. Conductive material suitable for the electrodes 122a and 122b and the floating gate 120 include gate material for field-effect transistors (FETs), such as finFETs. In the present implementation, the electrodes 122a and 122b and the floating gate 120 each include a metal. Specific examples of suitable metals for the electrodes 122a and 122b and the floating gate 120 include, but are not limited to, tantalum (Ta), tantalum nitride (TaN), titanium nitride (TiN), molybdenum (Mo), ruthenium (Ru), and tantalum carbide nitride (TaCN). In some implementations, the electrodes 122a and 122b and the floating gate 120 include the same conductive material as one another. Also, in some implementations, at least one of the electrodes 122a and 122b and the floating gate 120 includes different conductive material than at least one other of the electrodes 122a and 122b and the floating gate 120.

The dielectric region 124a is situated between the electrode 122a and the channel 112a of semiconductor fin 106a. The dielectric region 124b is situated between the channel 112a of semiconductor fin 106a and the floating gate 120. The dielectric region 124c is situated between the floating gate 120 and the channel 112b of the semiconductor fin 106b. The dielectric region 124d is situated between the channel 112b of the semiconductor fin 106b and the electrode 122b.

In the semiconductor device 100, the dielectric regions 124a, 124b, 124c, and 124d include dielectric material. Dielectric material suitable for the dielectric regions 124a, 124b, 124c, and 124d include gate dielectric material for FETs, such as finFETs. In the present implementation, the dielectric regions 124a, 124b, 124c, and 124d each include high-k dielectric material. Examples of high-k dielectric material for the dielectric regions 124a, 124b, 124c, and 124d include, as specific examples, hafnium oxide ($HfO_2$), zirconium oxide ($ZrO_2$), chromium oxide ($CrO_2$), and the like.

In some implementations, the dielectric regions 124a, 124b, 124c, and 124d include the same dielectric material as one another. Also, in some implementations, at least one of the dielectric regions 124a, 124b, 124c, and 124d includes different dielectric material than at least one other of the dielectric regions 124a, 124b, 124c, and 124d. In the present implementation, the dielectric regions 124a, 124b, 124c, and 124d are separate dielectric layers. However, in other implementations, at least any two of the dielectric regions 124a, 124b, 124c, and 124d can be part of a common dielectric layer. For example, the dielectric regions 124a and 124b can be part of a common dielectric layer, which extends over the semiconductor fin 106a. Similarly, the dielectric regions 124a and 124b can be part of a common dielectric layer, which extends over the semiconductor fin 106a.

The semiconductor device 100 can be configured for many applications including, as one example, a digital storage element in erasable programmable read-only memory (EPROM), electrically erasable programmable read-only memory (EEPROM) and flash memory. As other examples, the semiconductor device 100 can be configured as a neuronal computational element in neural networks, an analog storage element, an electronic potentiometer, and a single-transistor digital-to-analog converter (DAC). Furthermore, the semiconductor device 100 can be utilized with other semiconductor devices, which may be formed in the semiconductor fins 106a and/or 106b. In certain applications, the semiconductor fins 106a and/or 106b are doped differently than what is shown in FIGS. 1A and 1B.

The schematic diagram 140 in FIG. 1C corresponds to the semiconductor device 100 of the implementation shown in FIGS. 1A and 1B. The schematic diagram 140 includes a fin terminal A1 corresponding to the source 108a of the semiconductor fin 106a, a fin terminal B1 corresponding to the drain 110a of the semiconductor fin 106a, and an electrode terminal C1 corresponding to the electrode 122a. The schematic diagram 140 also includes a fin terminal A2 corresponding to the source 108b of the semiconductor fin 106b, a fin terminal B2 corresponding to the drain 110b of the semiconductor fin 106b, and an electrode terminal C2 corresponding to the electrode 122b.

The semiconductor fin 106a and/or the semiconductor fin 106b can be configured as a control gate. Any of the fin terminals A1, A2, B1, and B2 can correspond to a control gate situated in the semiconductor fin 106a or the semiconductor fin 106b. Where the semiconductor fin 106a and/or the semiconductor fin 106b are doped differently, only one or more of the fin terminals A1, A2, B1, and B2 may correspond to a control gate. The semiconductor device 100 can be a programmable non-volatile memory device. The control gate can be configured to control the channel 112a or 112b based on a programmed state of the floating gate 120. The programmed state can be achieved, for example, utilizing Fowler-Nordheim tunneling or hot-carrier injection.

In one configuration, the fin terminal A1 corresponds to the control gate, the fin terminal A2 corresponds to a source, and the fin terminal B2 corresponds to a drain of a programmable non-volatile memory device. At least one of the electrode terminals C1 and C2 can be coupled to ground. The fin terminal B1 can be shorted to the fin terminal A1, for example, by an electrode or by other means, such as through the channel 112a. In some implementations, the electrode terminal C1 is configured to invert the channel 112a to short the fin terminal A1 and the fin terminal B1. In some implementations, the channel 112a is doped to short the fin terminal A1 and the fin terminal B1.

Figure 2:
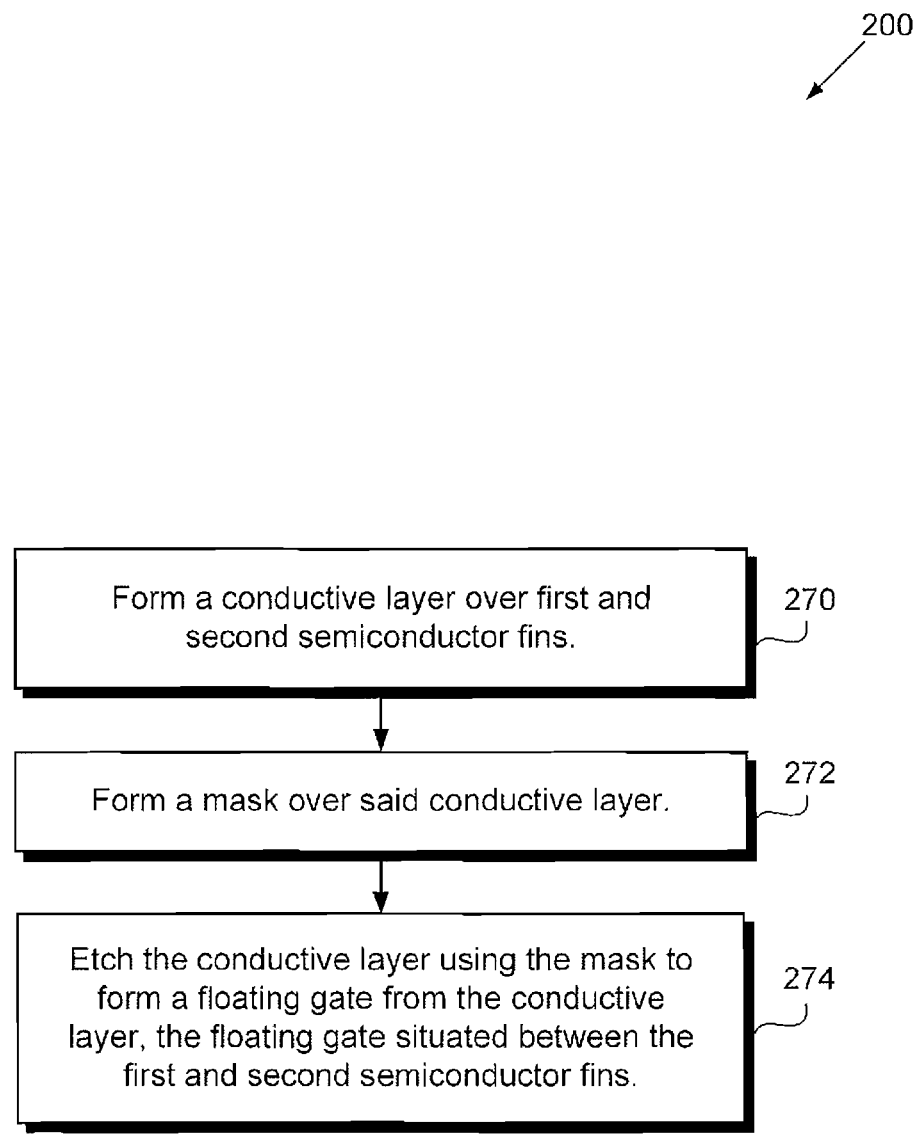
FIG. 2 shows a process flow diagram illustrating an exemplary process for fabricating a semiconductor device.

FIG. 2 shows a process flow diagram illustrating a process 200 for fabricating a semiconductor device, such as the semiconductor device 100. It is noted that the semiconductor device 100, as well as other semiconductor devices in accordance with the present disclosure, can be fabricated utilizing processes other than the process 200. Also, while applicable for fabricating different semiconductor devices, for illustrative purposes, the process 200 is described with respect to the semiconductor device 100 presented above with respect to FIGS. 1A, 1B, and 1C.

The implementation illustrated by the process 200 can be performed on a processed wafer. The processed wafer can correspond to the semiconductor device 100 prior to formation of the electrodes 122a and 122b and the floating gate 120. However, the processed wafer may include any of the other constituents of the semiconductor device 100, or at least some of those constituents may be formed later.

Figure 3A:
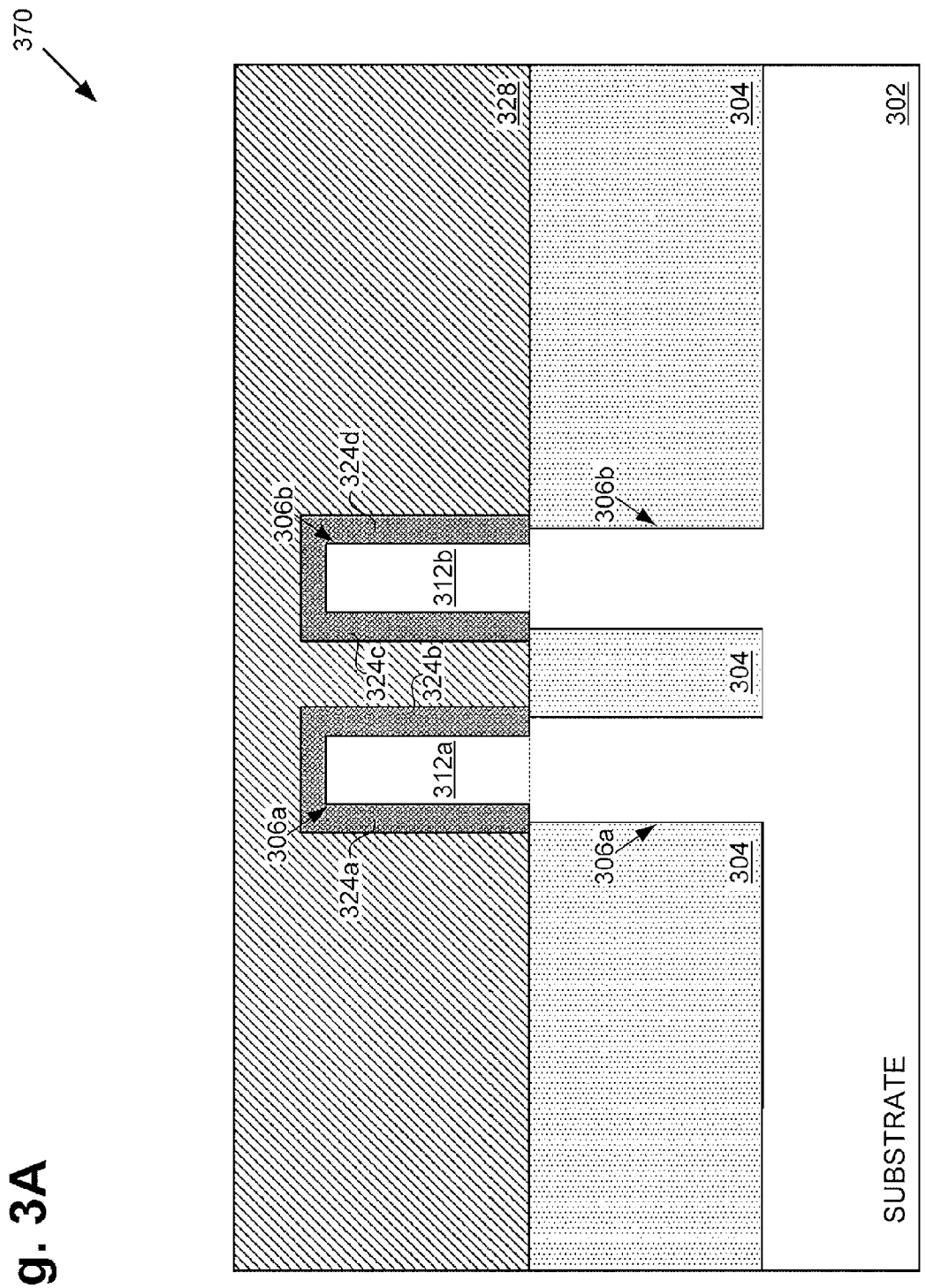
FIG. 3A illustrates a cross-sectional view of a portion of an exemplary wafer during processing.

Referring now to FIG. 2 and FIG. 3A, the process 200 includes forming a conductive layer (e.g., 328) over first and second semiconductor fins (e.g., 306a and 306b) (270 in FIG. 2).

FIG. 3A illustrates a cross-sectional view of a portion of an exemplary wafer during processing. More particularly, FIG. 3A illustrates a cross-sectional view of a portion of a wafer 370 during processing. The cross-sectional view illustrated in FIG. 3A can correspond to a cross section 3-3 of the semiconductor device 100 in FIGS. 1A and 1B during processing.

As shown in FIG. 3A, the wafer 370 includes a substrate 302, a dielectric layer 304, semiconductor fins 306a and 306b, channels 312a and 312b, dielectric regions 324a, 324b, 324c, and 324d, and a conductive layer 328. The substrate 302, the dielectric layer 304, the semiconductor fins 306a and 306b, the channels 312a and 312b, and the dielectric regions 324a, 324b, 324c, and 324d correspond to the substrate 102, the dielectric layer 104, the semiconductor fins 106a and 106b, the channels 112a and 112b, and the dielectric regions 124a, 124b, 124c, and 124d in the semiconductor device 100.

The conductive layer 328 is formed over the semiconductor fins 306a and 306b, and may also be formed over the substrate 302, the dielectric layer 304, the channels 312a and 312b, and the dielectric regions 324a, 324b, 324c, and 324d. The conductive layer 328 can include conductive material, such as those described above with respect to the electrodes 122a and 122b, and the floating gate 120. The conductive layer 328 can be formed over the semiconductor fins 306a and 306b by depositing one or more layers of conductive material, such as a metal, over the semiconductor fins 306a and 306b. The deposition can utilize physical vapor deposition (PVD), chemical vapor deposition (CVD), or another deposition technique. The deposited one or more layers of conductive material can then be planarized utilizing chemical mechanical planarization (CMP) or another planarization technique, resulting in the wafer 370 shown in FIG. 3A.

Figure 3B:
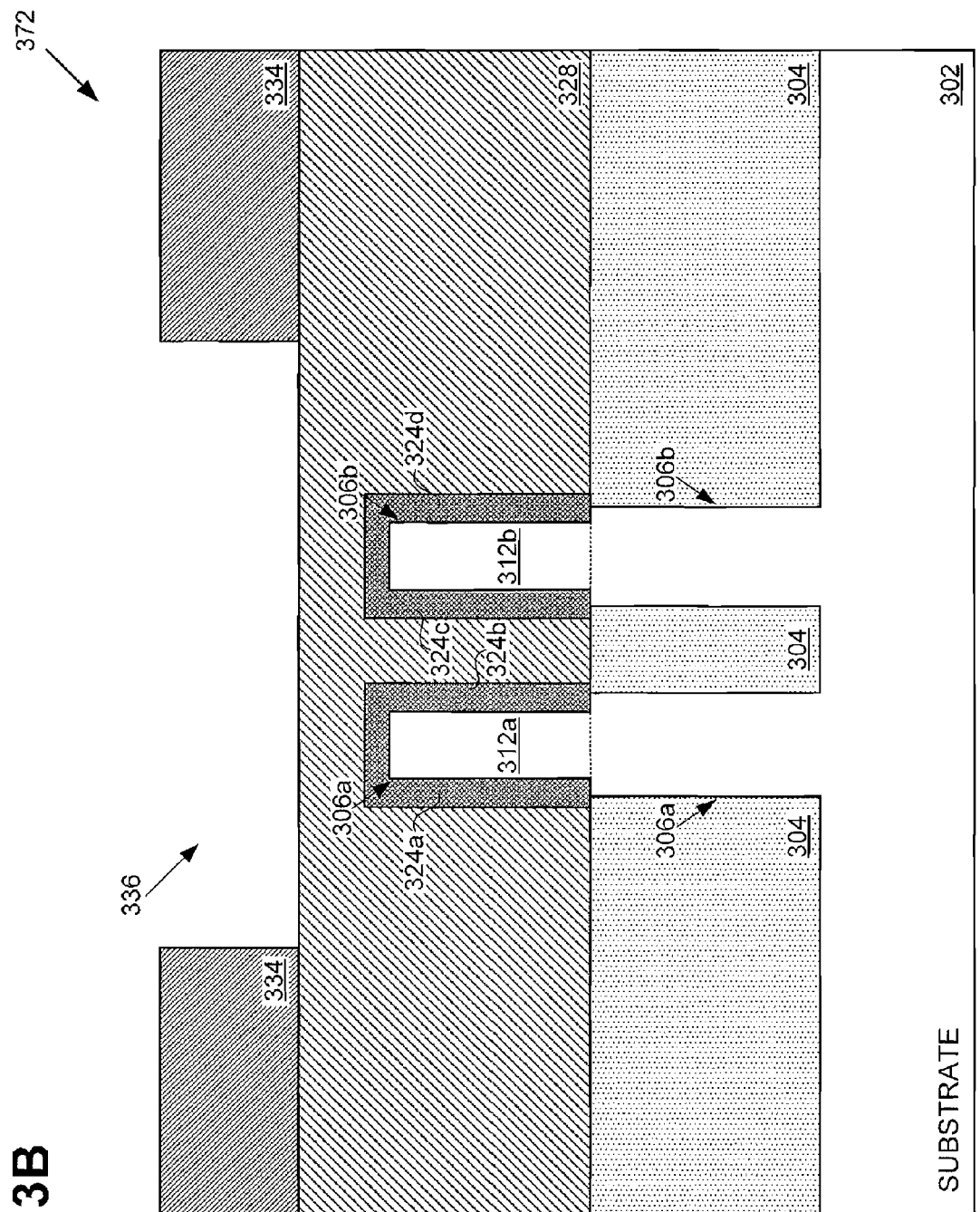
FIG. 3B illustrates a cross-sectional view of a portion of an exemplary wafer during processing.

Referring now to FIG. 2 and FIG. 3B, the process 200 includes forming a mask (e.g., 334) over the conductive layer (e.g., 328) (272 in FIG. 2).

FIG. 3B illustrates a cross-sectional view of a portion of an exemplary wafer during processing. More particularly, FIG. 3B illustrates a cross-sectional view of a portion of a wafer 372 during processing. The cross-sectional view illustrated in FIG. 3B can correspond to the cross section 3-3 of the semiconductor device 100 in FIGS. 1A and 1B during processing.

As shown in FIG. 3B, the wafer 372 includes a mask 334 formed over the conductive layer 328. The mask 334 exposes a region 336 of the conductive layer 328 that overlies the semiconductor fins 306a and 306b. The mask 334 can include photoresist. The mask 334 can be formed over the conductive layer 328 by applying photoresist to the wafer 370 of FIG. 3A over the conductive layer 328. The photoresist can be patterned to expose the region 336 of the conductive layer 328, resulting in the wafer 372 shown in FIG. 3B.

Figure 3C:
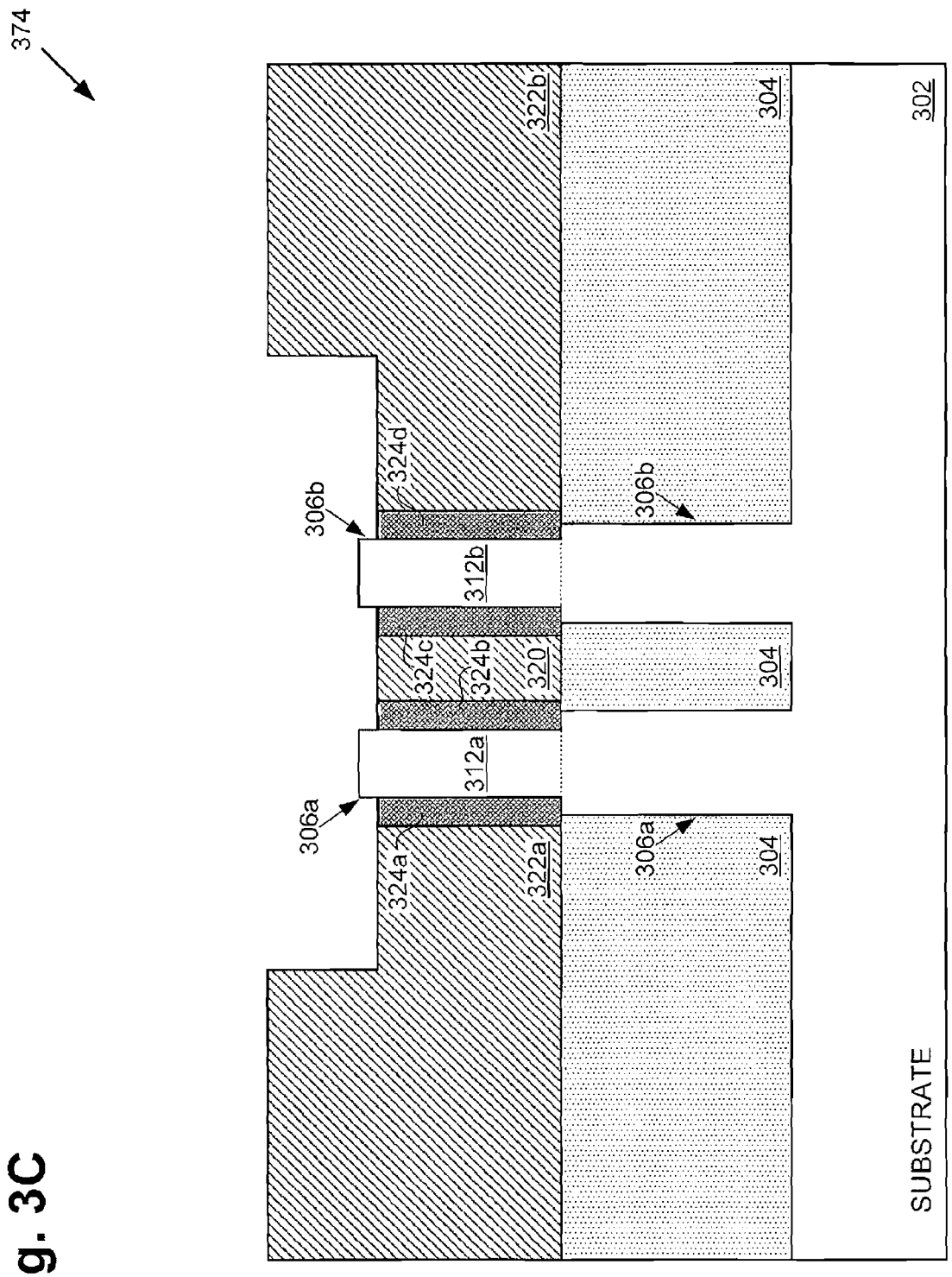
FIG. 3C illustrates a cross-sectional view of a portion of an exemplary wafer during processing.

Referring now to FIG. 2 and FIG. 3C, the process 200 includes etching the conductive layer (e.g., 328) using the mask (e.g., 334) to form a floating gate (e.g., 320) situated between the first and second semiconductor fins (e.g., 306a and 306b) (274 in FIG. 2).

FIG. 3C illustrates a cross-sectional view of a portion of an exemplary wafer during processing. More particularly, FIG. 3C illustrates a cross-sectional view of a portion of a wafer 374 during processing. The cross-sectional view illustrated in FIG. 3C can correspond to the cross section 3-3 of the semiconductor device 100 in FIGS. 1A and 1B during processing.

As shown in FIG. 3C, the wafer 374 includes a floating gate 320, an electrode 322a, and an electrode 322b. The floating gate 320, the electrode 322a, and the electrode 322b correspond to the floating gate 120, the electrode 122a, and the electrode 122b in the semiconductor device 100.

The floating gate 320 can be formed by etching the conductive layer 328 of the wafer 372 using the mask 334 of the wafer to form the floating gate 320 situated between the semiconductor fins 306a and 306b. Subsequently, the mask 334 can be removed, resulting in the wafer 374 shown in FIG. 3C. The etching of the conductive layer 328 can also form the electrodes 322a and 322b. Furthermore, the etching of the conductive layer 328 can also remove portions of dielectric material that forms the dielectric regions 324a, 324b, 324c, and 324d and can expose top portions of the semiconductor fins 306a and 306b. This can physically separate the dielectric regions 124a, 124b, 124c, and 124d. Alternatively, the dielectric material that forms the dielectric regions 324a, 324b, 324c, and 324d may be etched separately from the conductive layer 328 or may not be etched.

Additional processing can be performed on the wafer 374 to result in the semiconductor device 100. This additional processing may include formation of contacts and silicide for the contacts. Thus, the process 200 provides for fabrication of semiconductor devices, such as the semiconductor device 100, which can be a programmable non-volatile memory device. The process 200 can be integrated into processes for fabrication of one or more fin FETs. In some implementations, this intergration only requires an addition of the mask 334 for etching the conductive layer 328. However, the mask 334 may also be utilized for fabricating finFETs or other components.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor device comprising:
   a channel, a source, and a drain situated in a first semiconductor fin, said channel situated between said source and said drain;
   a control gate situated in a second semiconductor fin; and
   a floating gate situated between said first semiconductor fin and said second semiconductor fin, wherein
   said control gate is configured to control said channel based on a programmed state of said floating gate.

2. The semiconductor device of claim 1, further comprising:
   a first dielectric region situated between said floating gate and said first semiconductor fin.

3. The semiconductor device of claim 1, further comprising:
   a second dielectric region situated between said floating gate and said second semiconductor fin.

4. The semiconductor device of claim 1, wherein said first semiconductor fin is situated between a first dielectric region and a third dielectric region.

5. The semiconductor device of claim 1, wherein said second semiconductor fin is situated between a second dielectric region and a fourth dielectric region.

6. The semiconductor device of claim 1, wherein said first semiconductor fin is situated between said floating gate and a first electrode.

7. The semiconductor device of claim 1, wherein said second semiconductor fin is situated between said floating gate and a second electrode.

8. The semiconductor device of claim 1, wherein said floating gate comprises a metal.

9. A programmable non-volatile memory device comprising:
   a first semiconductor fin comprising a first channel, a first source and a first drain;
   a second semiconductor fin comprising a second channel, a second source and a second drain, said second semiconductor fin configured to be a control gate; and a floating gate situated between said first semiconductor fin and said second semiconductor fin, wherein said control gate is configured to control said first channel based on a programmed state of said floating gate.

10. The programmable non-volatile memory device of claim 9, further comprising:

a first electrode situated adjacent said first channel.

11. The programmable non-volatile memory device of claim 9, further comprising:

a second electrode situated adjacent said second channel.

12. The programmable non-volatile memory device of claim 9, further comprising:

a first dielectric region situated between said floating gate and said first channel of said first semiconductor fin.

13. The programmable non-volatile memory device of claim 9, further comprising:

a second dielectric region situated between said floating gate and said second channel of said second semiconductor fin.

14. The programmable non-volatile memory device of claim 9, wherein said first channel of said first semiconductor fin is situated between a first dielectric region and a third dielectric region.

15. The programmable non-volatile memory device of claim 9, wherein said second channel of said second semiconductor fin is situated between a second dielectric region and a fourth dielectric region.

16. A programmable non-volatile memory device comprising:

a first semiconductor fin comprising a first channel, a first source and a first drain;

a first electrode situated adjacent said first channel;

a second semiconductor fin comprising a second channel, a second source and a second drain, said second semiconductor fin configured to be a control gate;

a second electrode situated adjacent said second channel; and a floating gate situated between said first semiconductor fin and said second semiconductor fin, wherein said control gate is configured to control said first channel based on a programmed state of said floating gate.

17. The programmable non-volatile memory device of claim 16, wherein said first and second electrodes comprise a metal.

* * * * *